(12) United States Patent
Wang

(10) Patent No.: US 10,619,842 B1
(45) Date of Patent: Apr. 14, 2020

(54) HIGH-POWER LED LAMP WITH HEAT DISSIPATION EFFECT

(71) Applicant: WUXI JINSHUN LIGHTING TECHNOLOGY CO., LTD, Wuxi (CN)

(72) Inventor: Haijun Wang, Wuxi (CN)

(73) Assignee: WUXI JINSHUN LIGHTING TECHNOLOGY CO., LTD., Wuxi (CN)

( * ) Notice: Subject to any disclaimer, the term of this patent is extended or adjusted under 35 U.S.C. 154(b) by 0 days.

(21) Appl. No.: 16/411,167

(22) Filed: May 14, 2019

(30) Foreign Application Priority Data

Dec. 13, 2018 (CN) .......................... 2018 1 1525404

(51) Int. Cl.
| | | |
|---|---|---|
| *F21V 29/71* | (2015.01) | |
| *H01L 33/64* | (2010.01) | |
| *F21V 29/503* | (2015.01) | |
| *F21V 29/51* | (2015.01) | |
| *F21V 29/76* | (2015.01) | |
| *F21V 5/04* | (2006.01) | |
| *F21V 7/00* | (2006.01) | |
| *F21V 13/04* | (2006.01) | |
| *F21V 29/89* | (2015.01) | |
| *F21Y 115/10* | (2016.01) | |

(52) U.S. Cl.
CPC .............. *F21V 29/717* (2015.01); *F21V 5/04* (2013.01); *F21V 7/00* (2013.01); *F21V 13/04* (2013.01); *F21V 29/503* (2015.01); *F21V 29/51* (2015.01); *F21V 29/76* (2015.01); *F21V 29/89* (2015.01); *H01L 33/642* (2013.01); *H01L 33/648* (2013.01); *F21Y 2115/10* (2016.08)

(58) Field of Classification Search
CPC ...... F21V 29/503; F21V 29/51; F21V 29/717; F21V 29/76; F21V 29/89; F21V 5/04; F21V 7/00; F21V 13/04; H01L 33/642; H01L 33/648
See application file for complete search history.

(56) References Cited

U.S. PATENT DOCUMENTS

2009/0236626 A1* 9/2009 Xiao ..................... F21V 29/004 257/99
2011/0241549 A1* 10/2011 Wootton ................. F21S 8/006 315/117

* cited by examiner

*Primary Examiner* — Thomas M Sember
(74) *Attorney, Agent, or Firm* — Bayramoglu Law Offices LLC

(57) ABSTRACT

The present invention belongs to the technical field of high-power LED lamps, and relates to a high-power LED lamp with a heat dissipation effect, including a shell body. The shell body includes a heat sink main body and a heat sink cover board covering on a back surface of the heat sink main body. A plurality of heat pipes are embedded between the heat sink main body and the heat sink cover board, and an LED chip is placed on a front surface of the heat sink main body. The position of the heat sink main body where the LED chip is placed is the chip heat collecting area, all the heat pipes pass under the chip heat collecting area, and are in close contact with the chip heat collecting area.

7 Claims, 6 Drawing Sheets

HIGH-POWER LED LAMP WITH HEAT DISSIPATION EFFECT

CROSS REFERENCE TO THE RELATED APPLICATIONS

This application is based upon and claims priority to Chinese Patent Application No. 201811525404.7, filed on Dec. 13, 2018, the entire contents of which are incorporated herein by reference.

TECHNICAL FIELD

The present invention relates to a lamp, in particular to a high-power LED lamp with a heat dissipation effect, belonging to the technical field of high-power LED lamps.

BACKGROUND

In the prior art, a single surface-mount device (SMD) light source module is generally used as the mainstream light source module, and the power of the LED chip in the light source module is between 30 W and 50 W. The structure of the single light source module is composed of a light source board attached with a SMD, a lens, and a heat dissipation substrate. The heat dissipation substrate includes a main heat dissipation structure made of aluminum profile. If power is to be increased, multiple light source modules are required to be stacked together. For example, if the whole power of a lamp needs to be 150 W, a combination of three light source modules having a power of 50 W are required, which is disclosed in the patent with a patent application number of 201310189538.7. The light source modules of this structure cannot fully dissipate heat, and the light source is fixed on a heat dissipation board, and a lamp frame (i.e., a shell body) is required to combine the fixed light source modules, which increases the manufacturing cost of the lamp. In the practical application, since the single LED has poor ambient light perception, multiple modules are required to be stacked together, which makes the cost higher and the overall structure heavier.

A similar thermal phase transition technique is also used in the prior art, which is about a solution of thermal column. For example, in the patent with a patent application number of 201730529474.X, a solution of thermal column is used. Although the solution of the thermal phase transition of chip on board (COB) is used, the chip is directly fixed on the surface of the thermal column, so that the heat conduction and heat dissipation of the body of the lamp are decreased, however, a problem of insufficient utilization of the heat dissipating area exists, and a part of the heat pipe is exposed to the air, which is prone to cause the problems of oxidation, decay and air leakage, reducing the service life of the lamp.

The above solutions all have the common problem that the shell body of the lamp is a component for fixing the light source modules, and has no heat dissipation effect. In addition, light source modules with different power need to have lamps with different outer dimensions, so that multiple molds need to be repeatedly opened, increasing the cost. Moreover, a combination of a plurality of light source modules is required to achieve high power, which not only causes poor heat dissipation, but also brings great trouble for stocking in the large-scale production, increasing the cost of production materials, and lacking aesthetics in appearance.

SUMMARY

The objective of the present invention is to overcome the deficiencies in the prior art, and provide a high-power LED lamp with a heat dissipation effect. A heat pipe is provided in the shell body, the center position of the heat pipe abuts against a chip heat collecting area, the heat is stored in the chip heat collecting area, and the heat is effectively transmitted to the whole lamp body through the heat pipe, so that the lamp body is an integrated heat dissipation body, which is more conducive to heat dissipation of the lamp, and can carry high-power chips and reduce the cost as well.

In order to achieve the above technical objective, the technical solution of the present invention is as follows: a high-power LED lamp with a heat dissipation effect includes a shell body, and the shell body includes a heat sink main body and a heat sink cover board covering a back surface of the heat sink main body. A plurality of heat pipes are embedded between the heat sink main body and the heat sink cover board, and an LED chip is placed on a front surface of the heat sink main body. The position of the heat sink main body where the LED chip is placed is the chip heat collecting area, all the heat pipes pass under the chip heat collecting area, and are in close contact with the chip heat collecting area.

Further, the heat sink main body and the heat sink cover board are both formed by one-step die casting using aluminum.

Further, the heat sink main body includes a main body heat sink fin, and the heat sink cover board includes a cover board heat sink fin. A concave cavity/protrusion is provided on a position of the back surface of the heat sink main body corresponding to the chip heat collecting area. The cover board heat sink fin is provided with a protrusion/concave cavity matched with the concave cavity/protrusion. Moreover, a plurality of heat pipe passages for embedding the heat pipes are respectively provided on the main body heat sink fin and the cover board heat sink fin, and the heat sink main body, the heat pipes and the heat sink cover board are fixed together by screws.

Further, the heat pipe has a curved shape consistent with a shape of the heat pipe passage, and the heat pipe passage is formed by combining cavities between heat sink main body and the heat sink cover board covering the back surface of the heat sink main body. The surface of the heat pipe is coated with a heat conducting silicone grease, an end of the heat pipe is sealed with sealing glue, and an outer surface of the heat pipe is isolated from outside air after being assembled by pressing.

Further, the number of the heat pipes is equal or more than one, and the tops of the curved portions of the heat pipes are all located below the chip heat collecting area, and are in close contact with the chip heat collecting area. A thickness of the chip heat collecting area is ranging from 2 mm to 20 mm.

Further, the main body heat sink fin and the cover board heat sink fin are respectively one piece composed of a plurality of heat sink fins.

Further, a side of the heat sink main body includes a driving power source box, the driving power source is electrically connected to the LED chip, and the driving power source box is covered with a driving upper cover.

Further, the LED chip is covered with a glass lens, and the glass lens is covered with a glass mask.

Further, the LED chip, the glass lens covering on the LED chip, the glass mask having a protective effect and an optical effect, and a reflective panel having the function of reflecting mixed light on the front surface of the heat sink main body together form an integrated optical system.

Compared with existing LED lamps, the present invention has the following advantages:

1) The lamp of the present invention stores the heat in the chip heat collecting area, and the center position of the heat pipes abuts against the chip heat collecting area, so that the heat can be effectively conducted through the heat pipe passages, and then the heat is transferred to the heat sink main body and the heat sink cover board for effective heat dissipation. Moreover, the heat sink main body and the heat sink cover board respectively have a curved shape corresponding to the heat pipe for increasing the contact surface with the heat pipe.

2) The shell body includes a heat sink main body and a heat sink cover board, the heat sink main body and the heat sink cover board both contain heat sink fins, and are integratedly formed by aluminum die casting. The heat sink fin is provided with a heat pipe passage for embedding the heat pipe, and the heat pipe passing through the heat passage rising section of the heat pipe can more effectively conduct heat transfer, and finally transfer the heat to the shell body for heat dissipation. The whole lamp body is a heat dissipating body, which greatly improves the heat dissipation effect, can reduce the cost of the shell body, and brings more possibilities for the design of the shell body.

3) The heat pipe is surrounded by the heat sink main body and the heat sink cover board (i.e., the heat sink fins), and is isolated from the outside air, which can not only prevent the heat pipe from being damaged by air oxidation and increase the service life of the heat pipe, but also transfer the heat to the shell body through the heat pipe. Thus, the whole lamp becomes a heat sink body, which improves the heat dissipation effect, effectively reduces the light decay, and improves the service life of the whole lamp.

4) The high-power LED chip is fixed in front of the heat sink main body, and is placed in the chip heat collecting area. The high-power chip may be provided with a variety of lenses or reflectors with different light effects to achieve different purposes.

5) The lamp of the present invention has good heat dissipation effect and can carry LED chips with relatively high power, so it is no need to combine multiple lamp units. Moreover, the same outer shell body can be used for lamps with different powers, avoiding repeatedly opening multiple shell body molds, thus the shell body of the lamp is utilized effectively, the weight is decreased, the cost is greatly reduced, and the shape is beautiful.

6) The existed lamps are limited in the production of the outer shell body due to the limitations of the internal light source module and the heat dissipation component. However, in the present invention, the shell body of the lamp itself is used as a heat sink body, and the shape thereof can be set according to the actual application scenario, which has more options and a larger adapting range.

Description of the reference numbers: 1—LED chip, 2—glass lens, 3—heat sink main body, 31—driving power source, 32—driving upper cover, 33—main body heat sink fin, 4—heat pipe, 41—heat pipe passage, 42—heat passage rising section, 5—heat sink cover board, 51—cover board heat sink fin, 6—aluminum ring, 7—chip heat collecting area, and 8—glass mask.

DETAILED DESCRIPTION OF THE EMBODIMENTS

The specific embodiments of the present invention will be described in detail below with reference to the accompanying drawings. It should be understood that the specific embodiments described herein are only for illustrating and interpreting the present invention and are not intended to limit the present invention.

Embodiment 1

Figure 1:
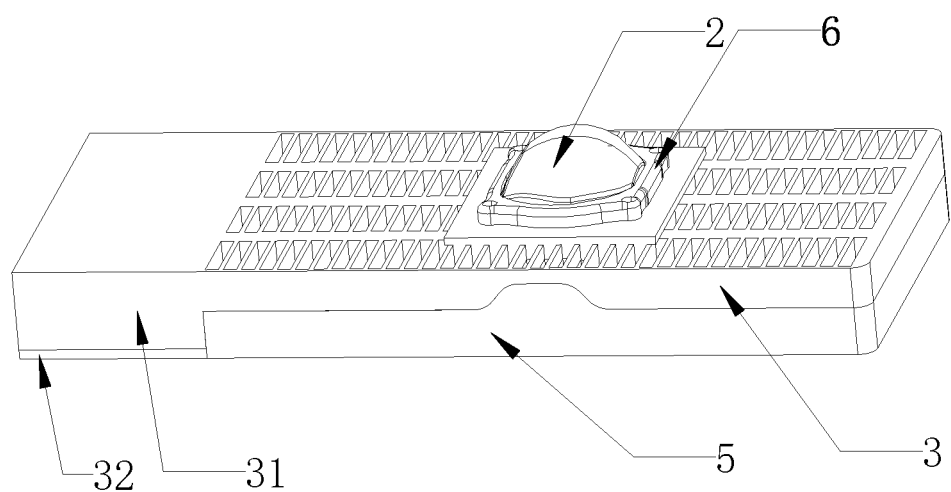
FIG. 1 is a structural schematic diagram of the lamp according to embodiment 1 of the present invention.
Figure 2:
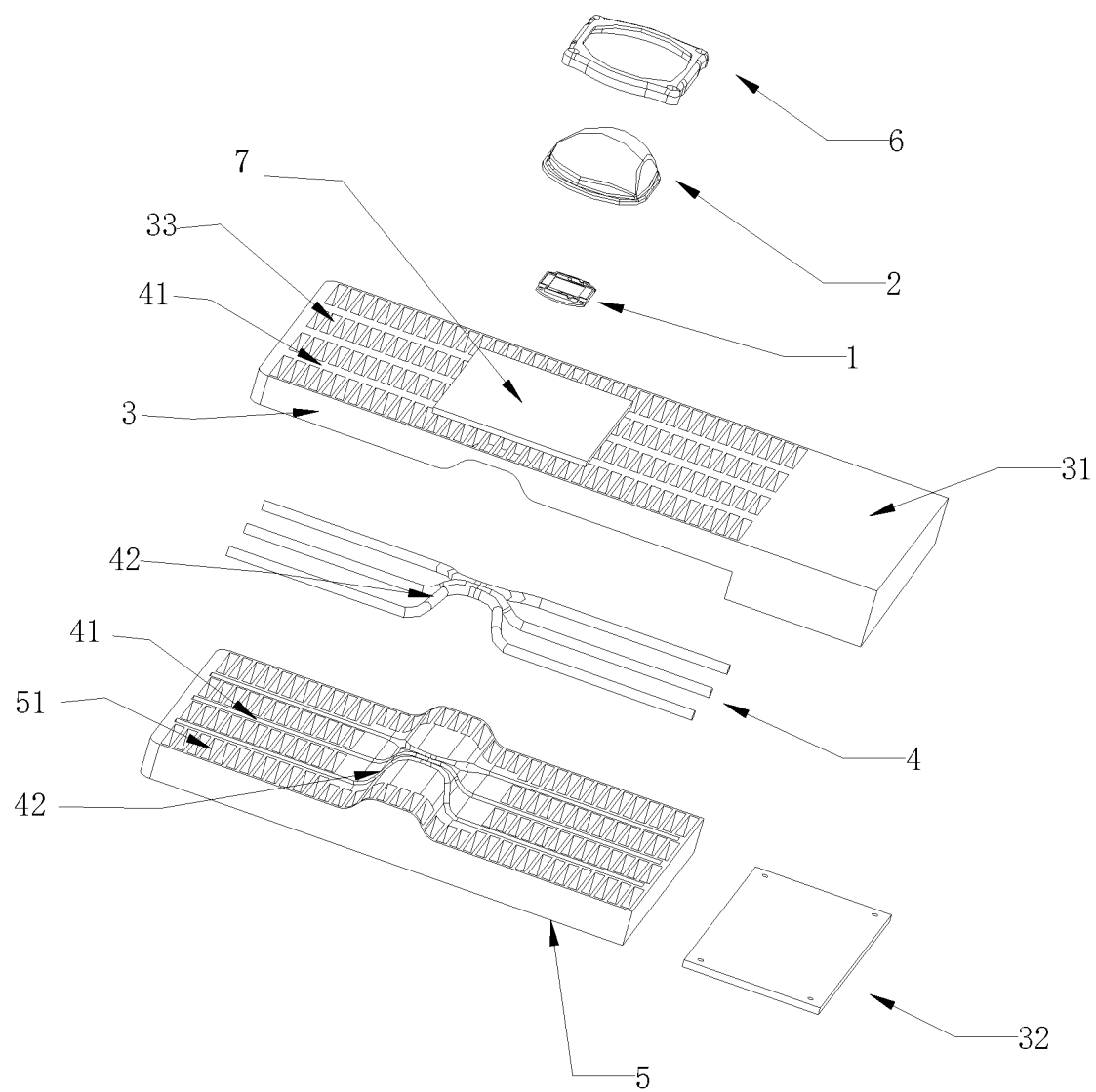
FIG. 2 is an exploded view of the lamp according to embodiment 1 of the present invention.
Figure 3:
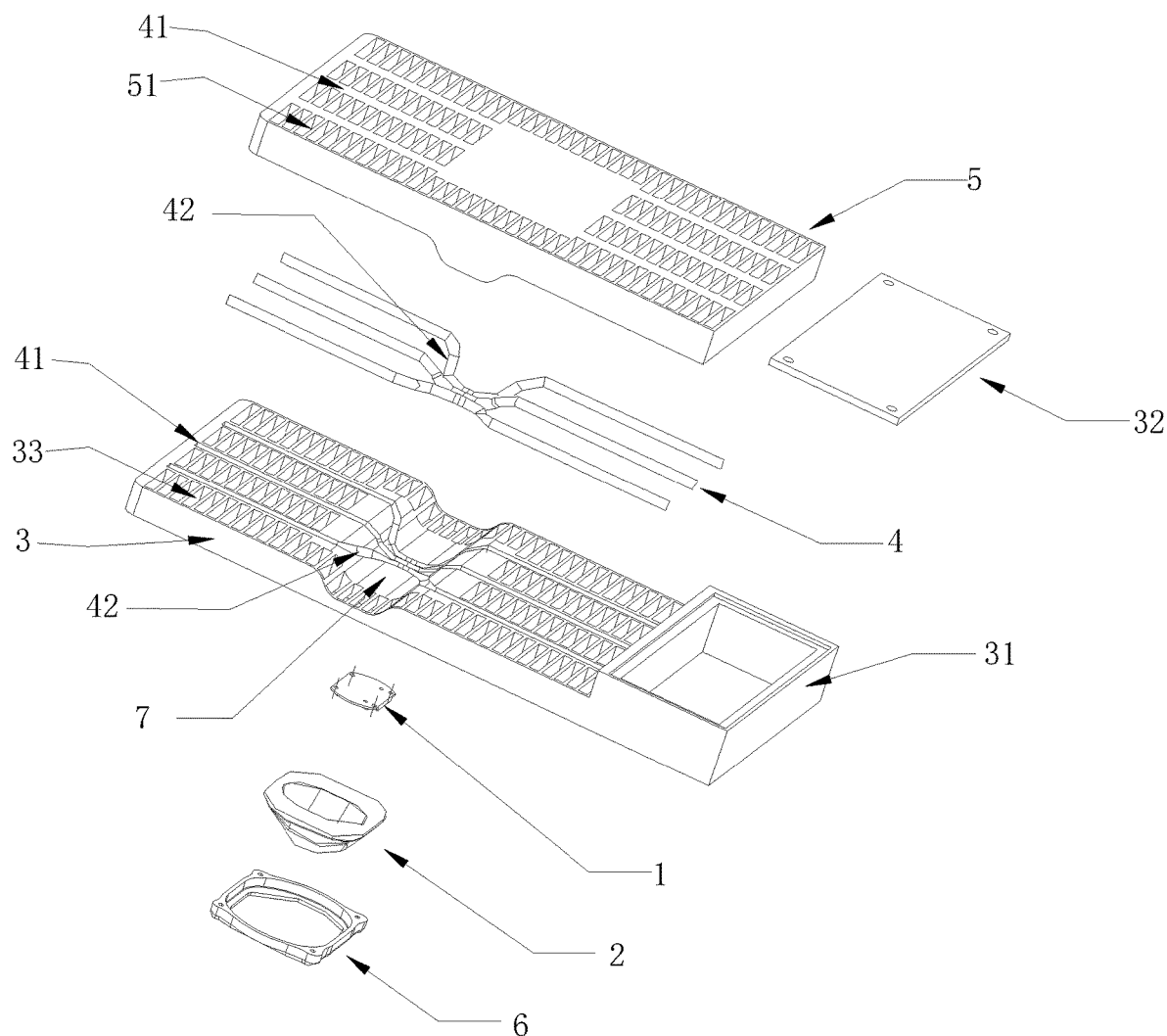
FIG. 3 is an exploded view of the lamp according to embodiment 1 of the present invention.

Referring to FIGS. 1-3, a high-power LED lamp with a heat dissipation effect includes a shell body. The shell body includes a heat sink main body 3, a heat sink cover board 5, and three heat pipes 4 embedded between the heat sink main body 3 and the heat sink cover board 5. The LED chip 1 is fixedly placed in a part of a chip heat collecting area 7 located on the front surface of the heat sink main body 3, and the LED chip 1 is covered with a glass lens 2. The glass lens 2 is pressed and fixed on the heat sink main body 3 by an aluminum ring 6. The thickness of the chip heat collecting area 7 is ranging from 2 mm to 20 mm, and the tops of the curved portions of all the heat pipes 4 are located below another part of the chip heat collecting area 7 on the back surface of the heat sink main body 3, and are in close contact with the chip heat collecting area 7. Moreover, the surface of the heat pipe 4 is coated with a heat conducting silicone grease, the end of the heat pipe 4 is sealed with a sealing glue, and the outer surface of the heat pipe 4 is isolated from the outside air after being assembled by pressing.

The heat sink main body 3 is provided with a main body heat sink fin 33, and the heat sink cover board 5 is provided with a cover board heat sink fin 51. The main body heat sink fin 33 and the cover board heat sink fin 51 are respectively one piece composed of a plurality of heat sink fins. A concave cavity is provided on a position of the main body heat sink fin 33 corresponding to the chip heat collecting area 7, and a central position of the cover heat sink fin 51 is provided with a protrusion matched with the concave cavity. Meanwhile, the main heat sink fin 33 and the cover board heat sink fin 51 are respectively provided with a plurality of heat pipe passages 41 for embedding the heat pipe 4, and the heat sink main body 3, the heat pipe 4, and the heat sink cover board 5 are fixed together by screws. The curved shape of the heat pipe 4 is consistent with the shape of the heat pipe passage 41, and the curved portion of the heat pipe passage 41 is a heat passage rising section 42 of heat pipe for effective heat conduction.

A side of the heat sink main body 3 is further provided with a driving power source 31. The driving power source 31 is electrically connected to the LED chip, and the driving power source 31 is covered with a driving upper cover 32.

Embodiment 2

Figure 4:
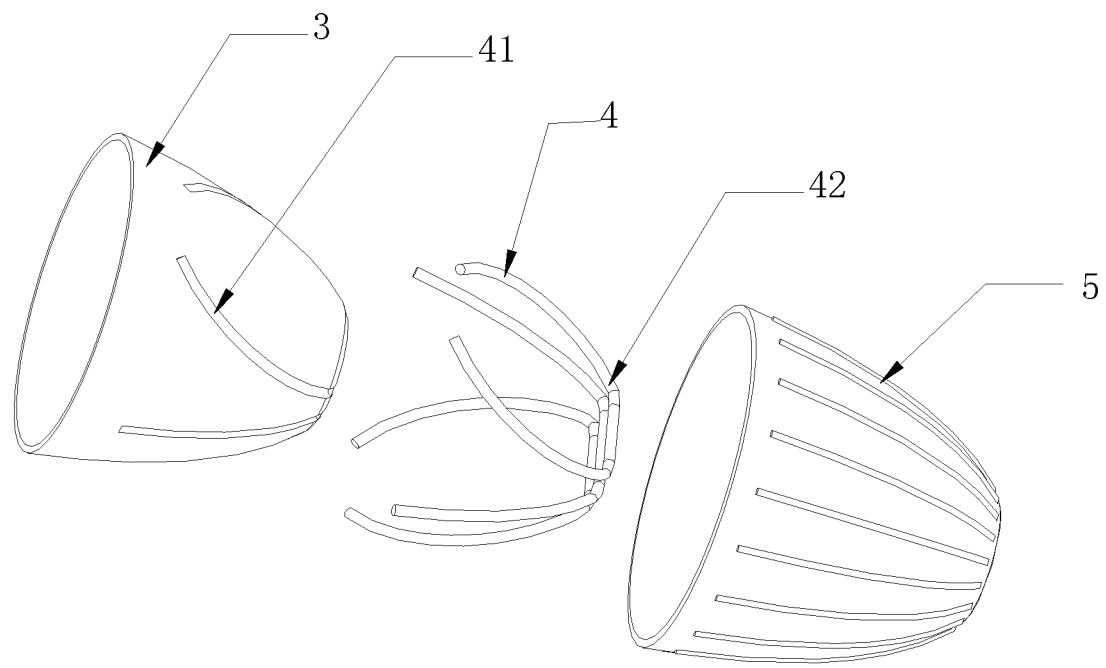
FIG. 4 is an exploded view of the lamp according to embodiment 2 of the present invention.
Figure 5:
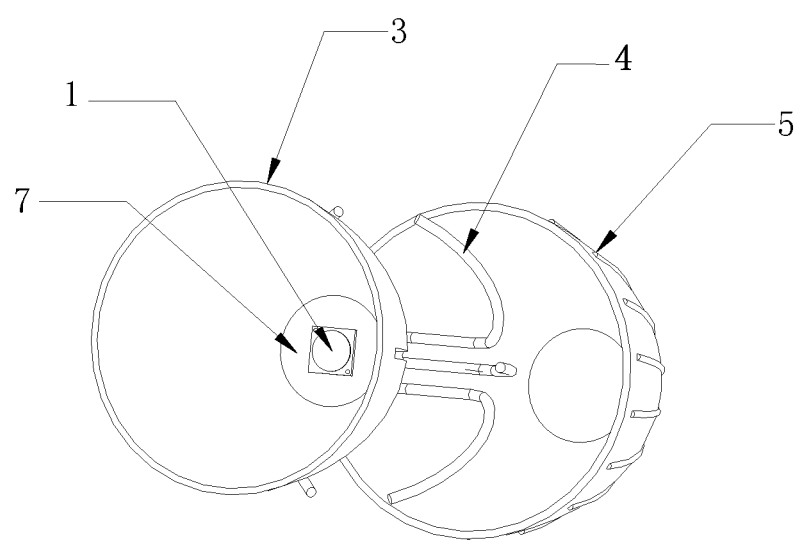
FIG. 5 is an exploded view of the lamp according to embodiment 2 of the present invention.

Referring to FIGS. 4-5, a high-power LED lamp with a heat dissipation effect includes a shell body. The shell body includes a heat sink main body 3, a heat sink cover board 5 covering the back surface of the heat sink main body 3, and three heat pipes 4 embedded between the heat sink main body 3 and the heat sink cover board 5. The LED chip 1 is fixedly placed in a chip heat collecting area 7 of the heat sink main body 3, and the thickness of the chip heat collecting area 7 is ranging from 2 mm to 20 mm. The tops of the curved portions of all the heat pipes 4 are located below the chip heat collecting area 7 on the back surface of the heat sink main body 3, and are in close contact with the chip heat collecting area 7. Moreover, the surface of the heat pipe 4 is coated with a heat conducting silicone grease, the end of the heat pipe 4 is sealed with a sealing glue, and the outer surface of the heat pipe 4 is isolated from the outside air after being assembled by pressing.

Three heat pipe passages 41 for embedding the heat pipes 4 are provided on the heat sink main body 3. The heat pipe 4 has a curved shape consistent with the shape of the heat pipe passage 41. The curved portion of the heat pipe passage 41 is a heat passage rising section 42 of heat pipe. The top portions of the curved portions of all the heat pipes 4 are located below the chip heat collecting area 7 and are closely attached to the chip heat collecting area 7. Both ends of the heat pipe 4 are inserted into the heat pipe passages 41 on the heat sink main body 3, and the heat sink main body 3, the heat pipe 4 and the heat sink cover board 5 are fixed together by screws.

Embodiment 3

Figure 6:
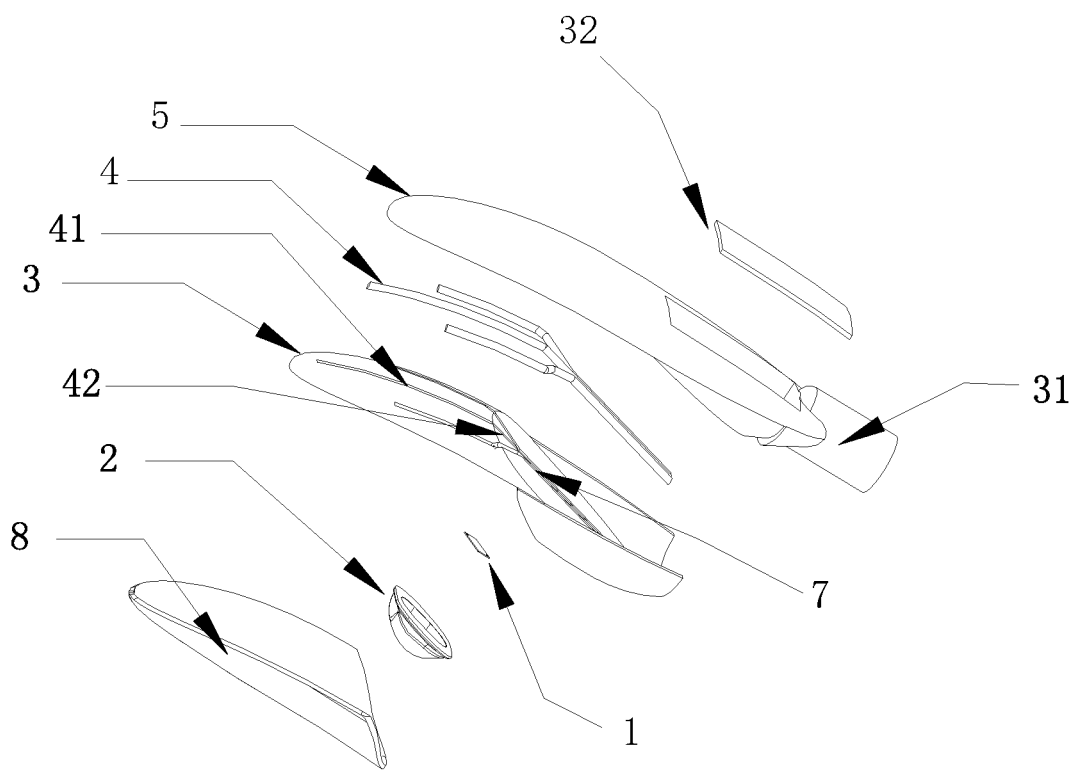
FIG. 6 is an exploded view of the lamp according to embodiment 3 of the present invention.

Referring to FIG. 6, a high-power LED lamp with a heat dissipation effect includes a shell body. The shell body includes a heat sink main body 3, a heat sink cover board 5, and three heat pipes 4 embedded between the heat sink main body 3 and the heat sink cover board 5. The LED chip 1 is fixedly placed in a part of a chip heat collecting area 7 located on the front surface of the heat sink main body 3. The LED chip 1 is covered with a glass lens 2, and the glass lens 2 is covered with a glass mask 8. The thickness of the chip heat collecting area 7 is ranging from 2 mm to 20 mm. The center portions of all the heat pipes 4 are located below another part of the chip heat collecting area 7 on the back surface of the heat sink main body 3, and are in close contact with the chip heat collecting area 7. Moreover, the surface of the heat pipe 4 is coated with a heat conducting silicone grease, the end of the heat pipe 4 is sealed with a sealing glue, and the outer surface of the heat pipe 4 is isolated from the outside air after being assembled by pressing.

The LED chip 1, the glass lens 2 covering on the LED chip 1, the glass mask 8 having a protective effect and an optical effect, and a reflective panel having the function of reflecting mixed light on the front surface of the heat sink main body 3 together form an integrated optical system.

Three heat pipe passages 41 for embedding the heat pipes 4 are provided on the heat sink main body 3. The heat pipe 4 has a curved shape consistent with the shape of the heat pipe passage 41. The curved portion of the heat pipe passage 41 is a heat passage rising section 42 of heat pipe. One end of each of the three heat pipes 4 is separated from each other, the tops of the central curved portions are located below the chip heat collecting area 7 and are in close contact with each other, and the other ends gather together and are all embedded in the heat pipe passages 41. Finally, the heat sink main body 3, the heat pipe 4 and the heat sink cover board 5 are fixed together by screws.

An end of the heat sink cover board 5 is further provided with a driving power source 31. The driving power source 31 is electrically connected to the LED chip, and the driving power source 31 is covered with a driving upper cover 32.

Embodiment 4

Figure 7:
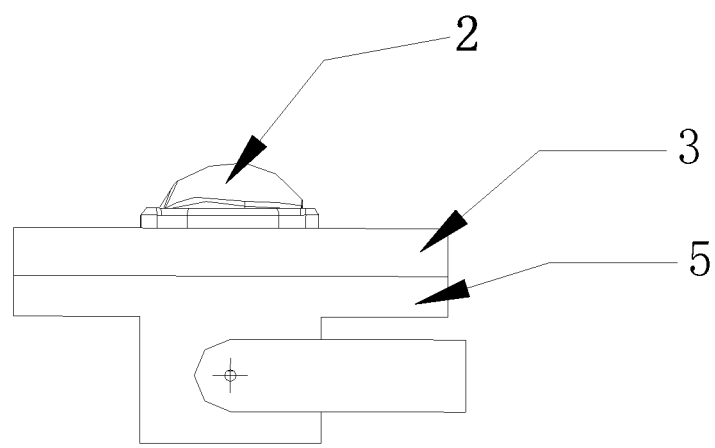
FIG. 7 is a structural schematic diagram of the lamp according to embodiment 4 of the present invention.
Figure 8:
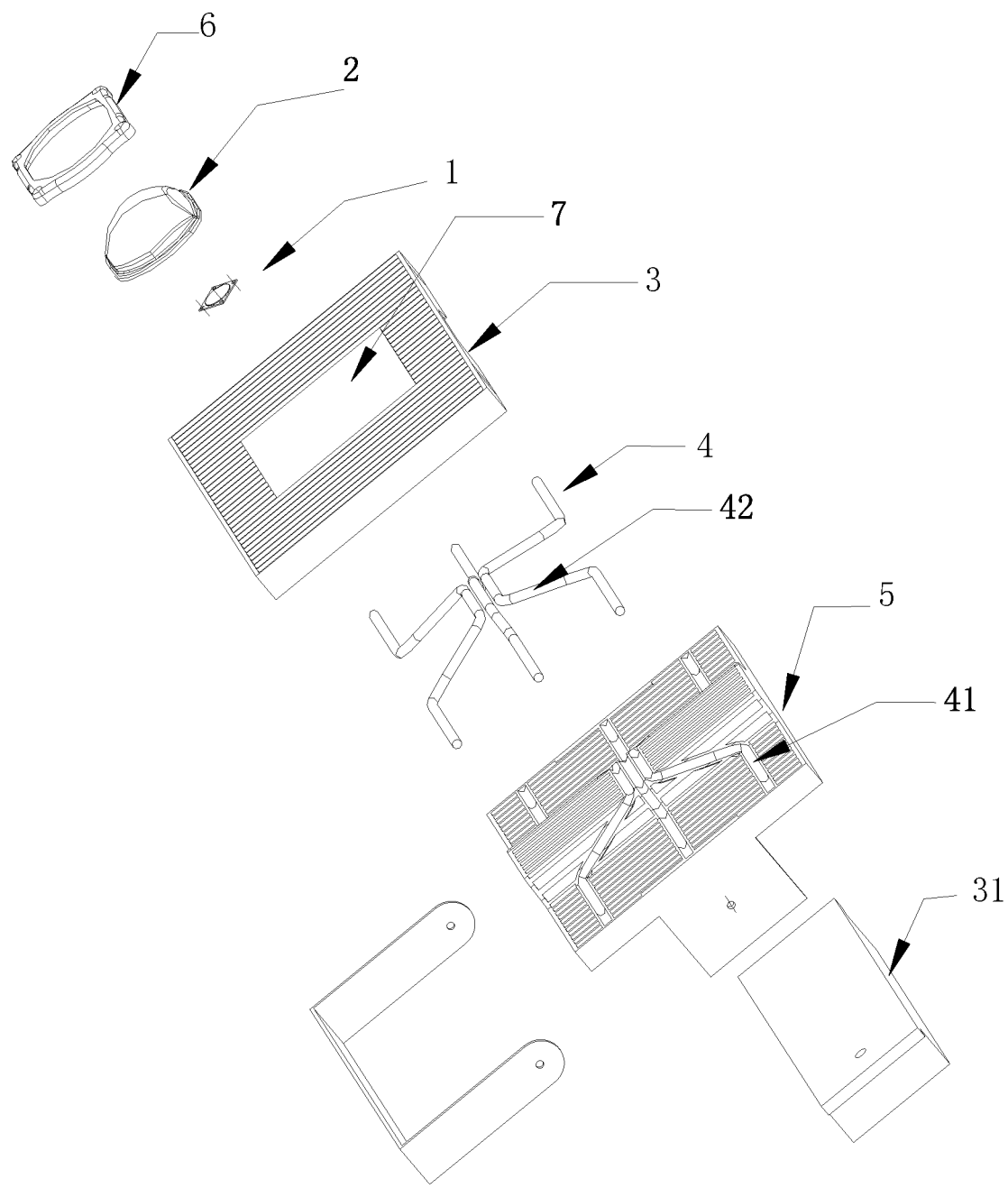
FIG. 8 is an exploded view of the lamp according to embodiment 4 of the present invention.

Referring to FIGS. 7-8, a high-power LED lamp with a heat dissipation effect includes a shell body. The shell body includes a heat sink main body 3, a heat sink cover board 5 covering on the back surface of the heat sink main body 3, and three heat pipes 4 embedded between the heat sink main body 3 and the heat sink cover board 5. The LED chip 1 is fixedly placed in a part of chip heat collecting area 7 located on the front surface of the heat sink main body 3. The LED chip 1 is covered with a glass lens 2, and the glass lens 2 is pressed and fixed on the heat sink main body 3 by an aluminum ring 6. The thickness of the chip heat collecting area 7 is ranging from 2 mm to 20 mm. The central curved portions of all the heat pipes 4 are located below another part of the chip heat collecting area 7 on the back surface of the heat sink main body 3, and are in close contact with the chip heat collecting area 7. Moreover, the surface of the heat pipe 4 is coated with a heat conducting silicone grease, the end of the heat pipe 4 is sealed with a sealing glue, and the outer surface of the heat pipe 4 is isolated from the outside air after being assembled by pressing.

Three heat pipe passages 41 for embedding the heat pipes 4 are provided on the heat sink main body 3. The heat pipe 4 has a curved shape consistent with the shape of the heat pipe passage 41. The curved portion of the heat pipe passage 41 is a heat passage rising section 42 of heat pipe. The central curved portions of all the heat pipes 4 are located below the chip heat collecting area 7 and are in close contact with each other. The two ends of the heat pipe 4 are inserted in the heat pipe passages 41, and the heat sink main body 3, the heat pipe 4 and the heat sink cover board 5 are fixed together by screws.

A driving power source 31 is mounted on the back surface of the heat sink cover board 5. The driving power source 31 is electrically connected to the LED chip, and a bracket is provided at each end of the driving power source 31.

The heat pipe 4 in the above embodiments includes a heat conducting copper pipe, and the heat sink main body 3 and the heat sink cover board 5 are both formed by one-step die casting using aluminum. The structures thereof are set according to a specific application scenario, and are not limited to the structures involved in the embodiments.

In the present invention, the LED chip 1 is firstly fixed on the chip heat collecting area 7 located on the front surface of the heat sink main body 3, and then the glass lens 2 covers on the LED chip 1 and is fixed on the heat sink main body 3 by using the aluminum ring 6. The heat generated during the operation of the LED chip 1 is absorbed and stored by the chip heat collecting area 7 due to the relatively great thickness of the chip heat collecting region 7. A heat pipe 4 and a heat sink cover board 5 are provided on the back surface of the heat sink main body 3. The top of the curved portion of the heat pipe 4 is in close contact with the chip heat collecting area 7 of the heat sink main body 3. The heat is transmitted to the heat pipe 4 through the chip heat collecting area 7, and the heat is efficiently transmitted to the whole lamp body and the areas of the heat sink fins through the heat passage rising section 42 of heat pipe. Meanwhile, the heat sink main body 3 (main body heat sink fin 33) and the heat sink cover board 5 (cover board heat sink fin 51) are provided with concave curved surfaces matched with the heat pipe 4 for increasing the contact area with the heat pipe 4, and completely covering the heat pipe 4, so that the heat of the heat pipe 4 is transmitted to the whole shell body (or the heat sink fin) to achieve heat dissipation, so that the whole lamp forms a heat sink body. Compared with the existed lamps, the lamp of the present invention can carry an LED chip with relatively large power, therefore, only one lamp unit is need rather than a plurality of lamp units, which effectively utilizes the shell body of the lamp and has light weight and low cost. The high-power LED chip 1 and the corresponding glass lens 2 can meet different requirements of light distribution. The main body heat sink fin 33 of the heat sink main body 3 is matched with the cover board heat sink fin 51 of the heat sink cover board 5 to form a complete curved surface, which can effectively realize air convection, thereby achieving the purpose of heat dissipation. The design of the heat passage rising section 42 of heat pipe for the heat pipe 4 and the heat pipe passage 41 can better conduct heat, and facilitates the heat dissipation of the heat sink fins covering around the heat pipe 4, thereby achieving a better heat dissipatation of the whole shell body. The heat emitted by the chip is evenly dispersed throughout the lamp by the shell body, thereby achieving the purpose of better heat dissipation.

The present invention and the embodiments thereof are described above. The description is not restrictive. The structures shown in the drawings are also only some of the embodiments of the present invention, and the actual structure is not limited thereto. In summary, if a person skilled in the art is inspired by these, without departing from the purpose of the present invention, the designed structures and embodiments similar to the technical scheme without creative design should all fall within the scope of protection of the present invention.

What is claimed is:

1. A high-power LED lamp with a heat dissipation effect, comprising: a shell body; wherein, the shell body includes a heat sink main body and a heat sink cover board covering a back surface of the heat sink main body, at least one heat pipe is embedded between the heat sink main body and the heat sink cover board, an LED chip is placed on a front surface of the heat sink main body, a position of the heat sink main body where the LED chip is placed is a chip heat collecting area, the at least one heat pipe passes under the chip heat collecting area, and is in close contact with the chip heat collecting area;

the heat sink main body comprises a main body heat sink fin, the heat sink cover board comprises a cover board heat sink fin, a concave cavity/protrusion is provided on a position of the back surface of the heat sink main body corresponding to the chip heat collecting area, the cover board heat sink fin is provided with a protrusion/concave cavity matching the concave cavity/protrusion, at least one heat pipe passage for embedding the at least one heat pipe is respectively provided on the main body heat sink fin and the cover board heat sink fin, and the heat sink main body, the at least one heat pipe and the heat sink cover board are fixed together by screws;

the at least one heat pipe has a curved shape consistent with a shape of at least one heat pipe passage, and the at least one heat pipe passage is formed by combining cavities between the heat sink main body and the heat sink cover board covering the back surface of the heat sink main body, the surface of the at least one heat pipe is coated with a heat conducting silicone grease, an end of the at least one heat pipe is sealed with a sealing glue, and an outer surface of the at least one heat pipe is isolated from outside air after being assembled by pressing.

2. The high-power LED lamp with the heat dissipation effect of claim 1, wherein, the heat sink main body and the heat sink cover board are both formed by one-step die casting using aluminum.

3. The high-power LED lamp with the heat dissipation effect of claim 1, wherein, a top of a curved portion of the at least one heat pipe is located below the chip heat collecting area, and is in close contact with the chip heat collecting area, and a thickness of the chip heat collecting area is ranging from 2 mm to 20 mm.

4. The high-power LED lamp with the heat dissipation effect of claim 1, wherein, the main body heat sink fin is one piece composed of a plurality of heat sink fins, and the cover board heat sink fin is another piece composed of a plurality of heat sink fins.

5. The high-power LED lamp with the heat dissipation effect of claim 1, wherein, the heat sink main body or heat sink cover board comprises a driving power source box, the driving power source is electrically connected to the LED chip, and the driving power source box is covered with a driving upper cover.

6. The high-power LED lamp with the heat dissipation effect of claim 1, wherein, the LED chip is covered with a glass lens, and the glass lens is covered with a glass mask.

7. The high-power LED lamp with the heat dissipation effect of claim 6, wherein, the LED chip, the glass lens covering on the LED chip, the glass mask having a protective effect and an optical effect, and a reflective panel having a function of reflecting mixed light on the front surface of the heat sink main body together form an integrated optical system.

* * * * *